United States Patent
Sakamoto et al.

(10) Patent No.: US 9,980,377 B2
(45) Date of Patent: May 22, 2018

(54) ELECTRONIC CIRCUIT DEVICE AND HEAT SINK STRUCTURE FOR THE SAME

(71) Applicant: TDK Corporation, Tokyo (JP)

(72) Inventors: Atsuki Sakamoto, Tokyo (JP); Mitsuru Watanabe, Tokyo (JP)

(73) Assignee: TDK Corporation (JP)

( * ) Notice: Subject to any disclaimer, the term of this patent is extended or adjusted under 35 U.S.C. 154(b) by 0 days. days.

(21) Appl. No.: 15/228,283

(22) Filed: Aug. 4, 2016

(65) Prior Publication Data
US 2017/0042066 A1 Feb. 9, 2017

(30) Foreign Application Priority Data

Aug. 5, 2015 (JP) ................. 2015-155352

(51) Int. Cl.
| | |
|---|---|
| *H05K 7/20* | (2006.01) |
| *H05K 1/11* | (2006.01) |
| *H02M 7/00* | (2006.01) |
| *H05K 1/18* | (2006.01) |
| *H05K 1/02* | (2006.01) |

(52) U.S. Cl.
CPC ............ *H05K 1/111* (2013.01); *H02M 7/003* (2013.01); *H05K 1/0203* (2013.01); *H05K 1/181* (2013.01); *H05K 2201/10166* (2013.01); *H05K 2201/10598* (2013.01)

(58) Field of Classification Search
CPC .......... H05K 1/181; H05K 7/20; H05K 1/111; H05K 5/00
USPC ........................................................ 361/719
See application file for complete search history.

(56) References Cited

U.S. PATENT DOCUMENTS

| | | | | |
|---|---|---|---|---|
| 5,311,395 | A * | 5/1994 | McGaha | H01L 23/3672 165/185 |
| 5,726,505 | A | 3/1998 | Yamada et al. | |
| 6,068,051 | A * | 5/2000 | Wendt | H01L 23/3675 165/185 |
| 6,385,047 | B1 * | 5/2002 | McCullough | H01L 23/367 165/185 |
| 6,408,507 | B1 * | 6/2002 | Goh | H05K 7/2039 29/564 |

(Continued)

FOREIGN PATENT DOCUMENTS

| | | |
|---|---|---|
| JP | 08-251818 A | 9/1996 |
| JP | 2004348544 A * | 12/2004 |
| JP | 2014-176242 A | 9/2014 |

*Primary Examiner* — Dion R Ferguson
*Assistant Examiner* — Mandeep S Buttar
(74) *Attorney, Agent, or Firm* — Harness, Dickey & Pierce, P.L.C.

(57) ABSTRACT

An electronic circuit device and a heat sink structure for the electronic circuit device capable of simultaneously achieving improved space efficiency and safeness are provided. The electronic circuit device includes: a substrate with circuit wiring formed thereon; an electronic component requiring heat dissipation, which is mounted on the substrate; and a heat sink structure configured to dissipate heat radiated by the electronic component requiring heat dissipation. The heat sink structure includes: a contact part to be in direct or indirect contact with the electronic component requiring heat dissipation; a generally tabular heat-dissipating part disposed substantially parallel to the substrate; and a connection part configured to connect between the contact part and the heat-dissipating part.

24 Claims, 13 Drawing Sheets

(56) References Cited

U.S. PATENT DOCUMENTS

| | | | | |
|---|---|---|---|---|
| 7,136,278 B2* | 11/2006 | Allen | ............... | H01H 9/0264 |
| | | | | 361/641 |
| 7,312,998 B2* | 12/2007 | Kamemoto | ......... | H05K 7/2049 |
| | | | | 165/185 |
| 2005/0225947 A1* | 10/2005 | Araujo | ............ | H05K 5/0008 |
| | | | | 361/719 |
| 2013/0088836 A1* | 4/2013 | Kuroda | ............... | H01L 23/42 |
| | | | | 361/700 |

* cited by examiner

ELECTRONIC CIRCUIT DEVICE AND HEAT SINK STRUCTURE FOR THE SAME

BACKGROUND OF THE INVENTION

1. Field of the Invention

The present invention relates to an electronic circuit device including an electronic circuit constituted by electronic components and circuit wiring, and a heat sink structure for the electronic circuit device.

2. Description of the Related Art

A backflow prevention circuit or an ORing circuit may be provided on the output side (load side) of a power-supply device such as a DC-DC converter or an AC-DC converter in the conventional techniques (see Japanese Patent Application Laid-Open No. Hei. 8-251818 or Japanese Patent Application Laid-Open No. 2014-176242, for example). Of these, the backflow prevention circuit is used to prevent, when a secondary battery, for example, is connected as a load, the inflow (i.e., backflow) of current from the secondary battery to the power-supply device or to prevent the backflow of current from the output side to a power-supply device due to unequal outputs from a plurality of power-supply devices connected in parallel.

The ORing circuit is used, when a plurality of power-supply devices connected in parallel are used, to achieve stable power supply to a load by disconnecting a failed power-supply device from the load and to prevent the backflow of current to the power-supply device. Moreover, the provision of the ORing circuit allows for the replacement or repair of the failed power-supply device while power supply to the load is continued.

Such backflow prevention circuits and ORing circuits typically utilize the rectification of a diode in the conventional techniques. In recent years, however, mainstream backflow prevention circuits and ORing circuits perform switching between connection and disconnection of a power-supply device to and from a load by a switching element such as a metal oxide semiconductor field effect transistor (MOSFET). Since power supply from the power-supply device to the load is performed via these circuits, the use of the switching element, instead of the diode, can reduce power loss. In particular, when output power is large, such circuits are effective to use.

CITATION LIST

SUMMARY OF THE INVENTION

When the backflow prevention circuit or the ORing circuit is provided on the output side of the power-supply device, such a circuit is typically integrated into the power-supply device as one circuit included in the power-supply device. In such a case, however, the entire power-supply device is manufactured as a custom-made product, thus lacking versatility and increasing costs.

When the backflow prevention circuit or the ORing circuit is configured as an external electronic circuit device with respect to the power-supply device, on the other hand, the versatility and cost problems can be solved. Such a configuration, however, leads to a problem of deteriorated space efficiency as compared to the case where the circuit is integrated into the power-supply device.

Specifically, an amount of heat generation is relatively large in these circuits since current constantly flows through the diode or the switching element during power supply. Thus, a sufficient level of heat dissipation performance needs to be ensured by providing a dedicated heat sink device. Furthermore, when these circuits are connected to the power-supply devices, improper connection regarding the input and output directions of power and polarities leads not only to failed function but also to a risk of ignition due to an increased amount of heat generation, for example. Thus, measures to prevent improper connection need to be taken, for example, by clearly indicating the connecting directions. Therefore, when the backflow prevention circuit or the ORing circuit is configured as an external electronic circuit device, space efficiency is compelled to deteriorate in order to ensure safeness in the conventional techniques.

The present invention has been made in view of the aforementioned problems. It is an object of the invention to provide an electronic circuit device and a heat sink structure for the electronic circuit device capable of simultaneously achieving improved space efficiency and safeness.

(1) An aspect of the present invention provides an electronic circuit device including: a substrate with circuit wiring formed thereon; an electronic component requiring heat dissipation, which is mounted on the substrate; and a heat sink structure configured to dissipate heat radiated by the electronic component requiring heat dissipation. The heat sink structure includes: a contact part to be in direct or indirect contact with the electronic component requiring heat dissipation; a generally tabular heat-dissipating part disposed substantially parallel to the substrate; and a connection part configured to connect between the contact part and the heat-dissipating part.

(2) In the electronic circuit device in (1) described above, the heat-dissipating part has a surface opposite to the substrate, the surface also functioning as an indication part configured to indicate information.

(3) The electronic circuit device in (2) described above further includes a connection terminal that is mounted on the substrate and to be connected to an external device, and the indication part indicates information about connection of the connection terminal.

(4) In the electronic circuit device in (3) described above, the heat-dissipating part is disposed on the same side as the connection terminal with respect to the substrate.

(5) The electronic circuit device in (4) described above further includes two connection terminals as the connection terminal to be connected to respective different devices, and the heat-dissipating part is disposed between the two connection terminals.

(6) In the electronic circuit device in any one of (2) to (5) described above, information is engraved on the indication part.

(7) In the electronic circuit device in any one of (1) to (6) described above, the contact part is formed in a generally tabular shape disposed substantially parallel to the substrate, and the connection part is formed in a generally tabular shape continuously connecting between ends of the contact part and the heat-dissipating part positioned on the same side.

(8) In the electronic circuit device in (7) described above, the heat-dissipating part has an extended length from the connection part which is larger than an extended length of the contact part from the connection part.

(9) In the electronic circuit device in any one of (1) to (8) described above, the substrate is provided with a heat-dissipating region where the electronic component requiring heat dissipation is disposed, and the contact part is formed in a size to cover the entire heat-dissipating region.

(10) In the electronic circuit device in (9) described above, a plurality of electronic components requiring heat dissipation are disposed in the heat-dissipating region.

(11) In the electronic circuit device in any one of (1) to (10) described above, the contact part includes a protrusion on a surface closer to the substrate.

(12) In the electronic circuit device in any one of (1) to (11) described above, the heat sink structure includes a generally tabular auxiliary heat-dissipating part connected to the connection part or configured as part of the connection part, and the auxiliary heat-dissipating part is disposed substantially parallel to the substrate between the contact part and the heat-dissipating part.

(13) The electronic circuit device in any one of (1) to (12) described above further includes a protective case configured to cover at least part of the substrate and at least part of the heat sink structure, and the protective case is provided with a window at a position corresponding to the heat-dissipating part.

(14) Another aspect of the present invention provides a heat sink structure for an electronic circuit device, including: a contact part to be in direct or indirect contact with an electronic component requiring heat dissipation, which is mounted on a substrate; a generally tabular heat-dissipating part disposed substantially parallel to the substrate; and a connection part configured to connect between the contact part and the heat-dissipating part.

The electronic circuit device and the heat sink structure for the electronic circuit device according to the present invention can provide an advantageous effect allowing for the simultaneous achievement of improved space efficiency and safeness.

DETAILED DESCRIPTION OF THE PREFERRED EMBODIMENTS

Embodiments of the present invention will now be described below with reference to the accompanying drawings.

Figure 1A:
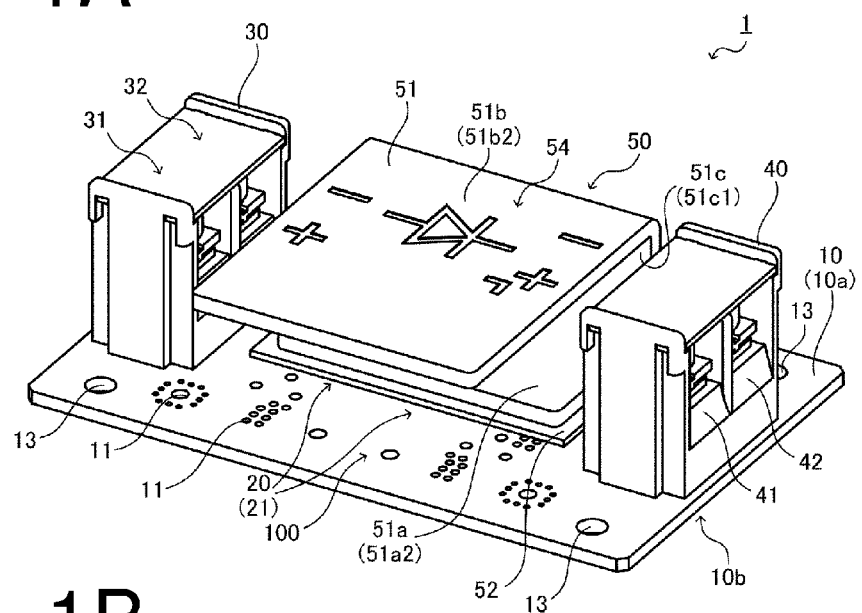
FIGS. 1A and 1B are schematic perspective views of an electronic circuit device according to a first embodiment of the present invention.
Figure 1B:
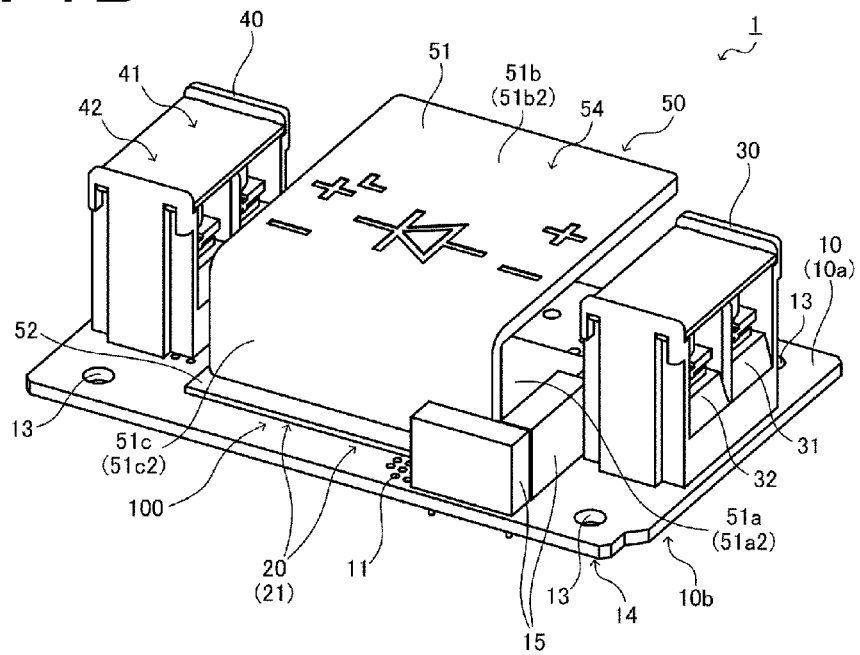
Figure 2:
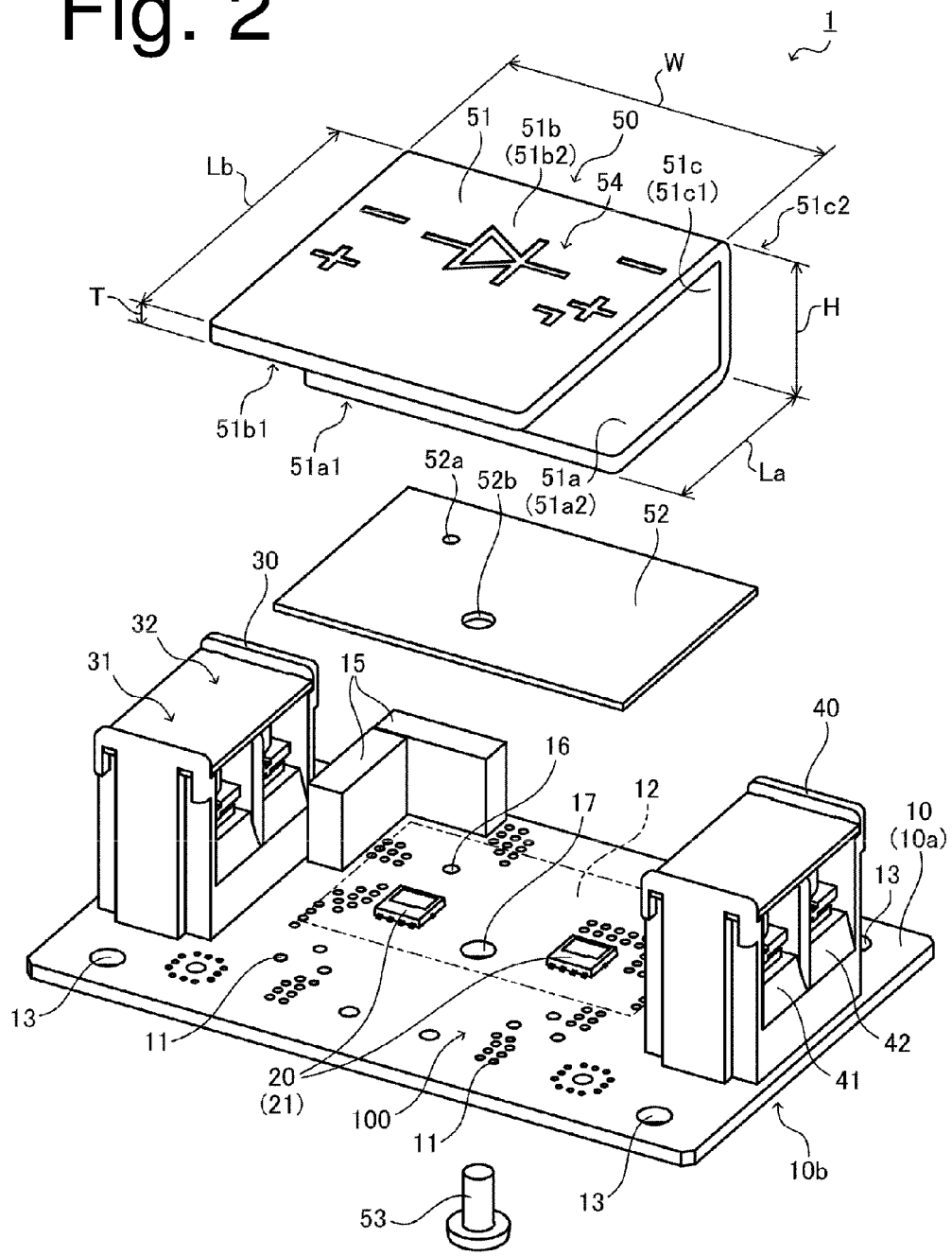
FIG. 2 is a schematic exploded perspective view of the electronic circuit device.
Figure 3A:
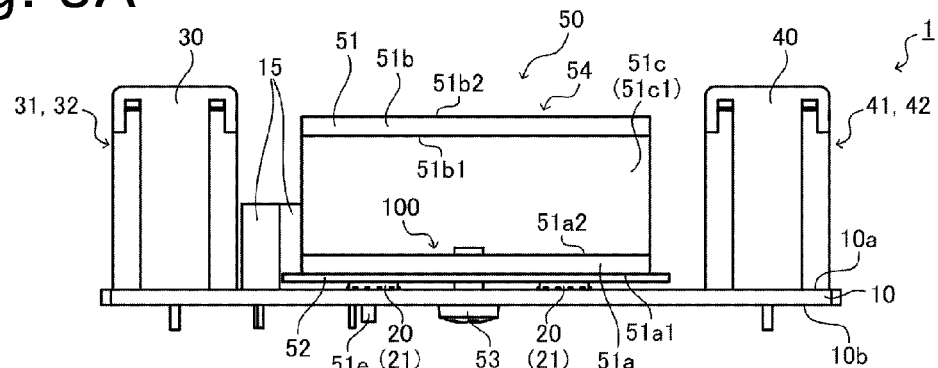
FIG. 3A is a schematic front view of the electronic circuit device.
Figure 3B:
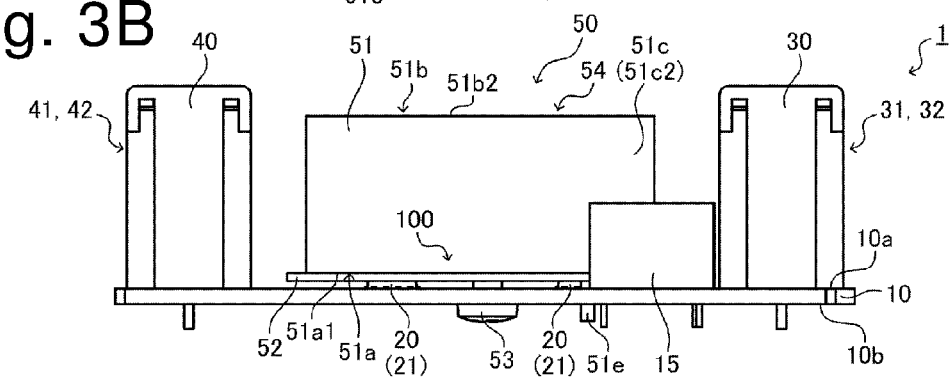
FIG. 3B is a schematic rear view of the electronic circuit device.
Figure 3C:
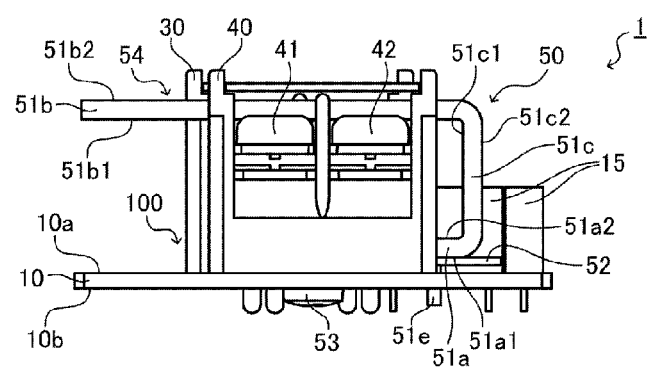
FIG. 3C is a schematic right side view of the electronic circuit device.
Figure 3D:
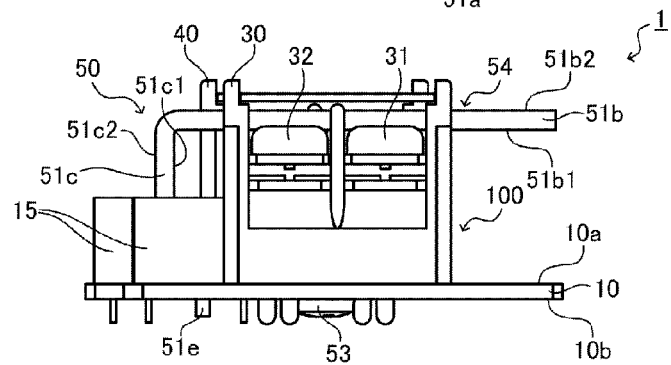
FIG. 3D is a schematic left side view of the electronic circuit device.
Figure 4A:
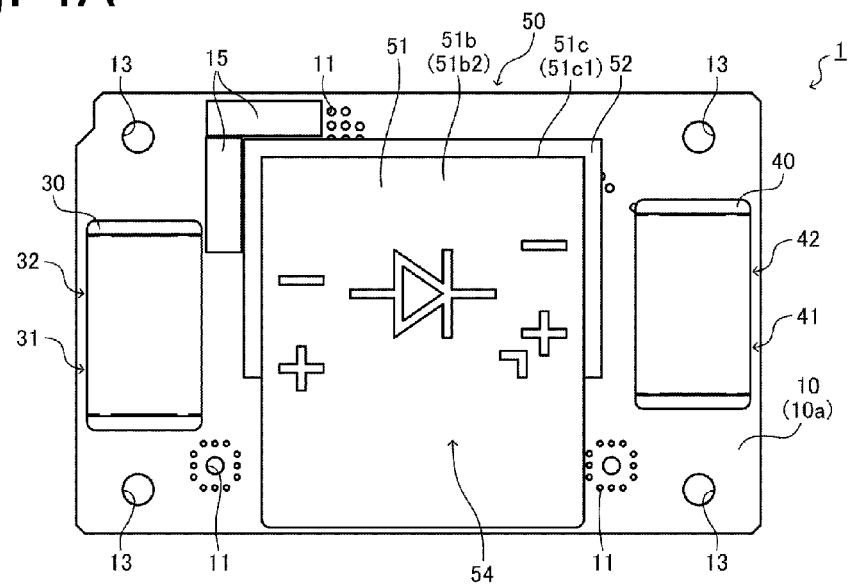
FIG. 4A is a schematic plan view of the electronic circuit device.
Figure 4B:
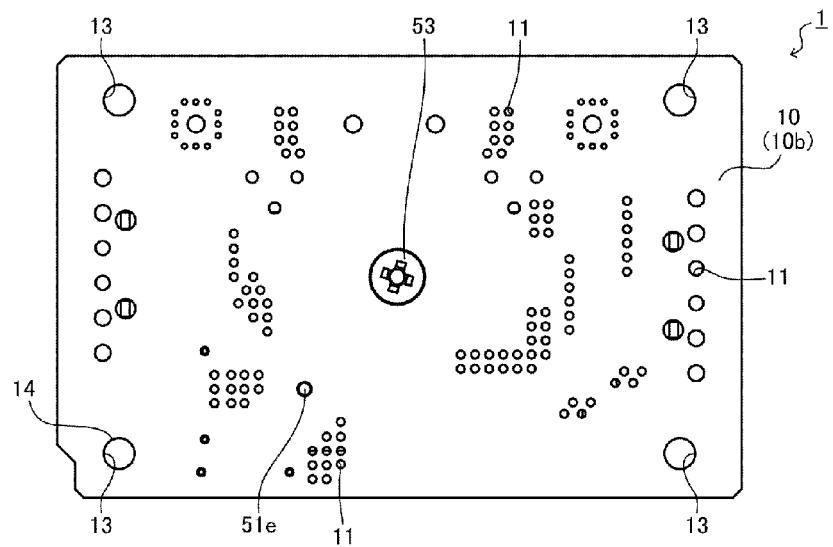
FIG. 4B is a schematic bottom view of the electronic circuit device.

An electronic circuit device 1 according to a first embodiment of the present invention will be described first. FIGS. 1A and 1B each show a schematic perspective view of the electronic circuit device 1 according to the present embodiment. FIG. 1A shows the electronic circuit device 1 as viewed from its front side, whereas FIG. 1B shows the electronic circuit device 1 as viewed from its rear side. FIG. 2 is a schematic exploded perspective view of the electronic circuit device 1. FIG. 3A is a schematic front view of the electronic circuit device 1, FIG. 3B is a schematic rear view of the electronic circuit device 1, FIG. 3C is a schematic right side view of the electronic circuit device 1, and FIG. 3D is a schematic left side view of the electronic circuit device 1. FIG. 4A is a schematic plan view of the electronic circuit device 1, and FIG. 4B is a schematic bottom view of the electronic circuit device 1.

The electronic circuit device 1 of the present embodiment is a backflow prevention device including a backflow prevention circuit 100. The electronic circuit device 1 is used with connection between an output terminal of a power-supply device for outputting direct-current power, such as a DC-DC converter or an AC-DC converter, and a load being established. As shown in these figures, the electronic circuit device 1 includes: a substrate 10 on which circuit wiring is formed and various electronic components, for example, are mounted; electronic components 20 requiring heat dissipation, mounted on the substrate 10; an input-side connection terminal 30 and an output-side connection terminal 40 mounted on the substrate 10; and a heat sink structure 50 fixed to the substrate 10.

The substrate 10 is a glass epoxy substrate, for example, formed in a generally rectangular tabular shape. The substrate 10 is provided with multilayer circuit wiring (not shown) and a plurality of through holes 11. The electronic components 20 requiring heat dissipation and various electronic components (not shown) are mounted on an upper surface 10a of the substrate 10. These electronic components and the circuit wiring together constitute the backflow prevention circuit 100. Note that the substrate 10 may be any one of a single-sided board, a double-sided board, a multi-layer board, and the like. The material of the substrate is not limited to any particular material.

A heat-dissipating region 12 where heat is dissipated by the heat sink structure 50 is provided at a central part of the upper surface 10a of the substrate 10. In the present embodiment, only the electronic components 20 requiring heat dissipation are disposed in the heat-dissipating region 12 and other components (not shown) are disposed in a region other than the heat-dissipating region 12. Through-holes 13 used for fixing the substrate 10 to an external member, for example, are provided near the four corners of the substrate 10. A ground terminal 14 is provided on a bottom surface 10b side of one of these through-holes 13. Two grounded capacitors 15 are disposed near the ground terminal 14.

The electronic component 20 requiring heat dissipation is an electronic component having a large amount of heat generation as compared to other electronic components mounted on the substrate 10 and thus necessary to dissipate heat. Since the electronic circuit device 1 of the present embodiment includes the backflow prevention circuit 100, a switching element 21 such as a MOSFET is the electronic component 20 requiring heat dissipation. In the present embodiment, the two switching elements 21 are provided as the electronic components 20 requiring heat dissipation, and these switching elements 21 are disposed in the heat-dissipating region 12 with an appropriate interval therebetween.

The input-side connection terminal 30 is a terminal to be connected to the output terminal of the power-supply device and mounted at a left end portion of the upper surface 10a of the substrate 10. The output-side connection terminal is a terminal to be connected to the load that receives power supply from the power-supply device and mounted at a right end portion of the upper surface 10a of the substrate 10. The input-side connection terminal 30 is constituted by: an input-side positive terminal 31 to be connected to the positive side of the output terminal of the power-supply device; and an input-side negative terminal 32 to be connected to the negative side of the output terminal of the power-supply device. Similarly, the output-side connection terminal 40 is constituted by: an output-side positive terminal 41 to be connected to the positive side of the load; and an output-side negative terminal 42 to be connected to the negative side of the load.

The input-side positive terminal 31 and the output-side positive terminal 41 are connected to each other via the two switching elements 21 connected in parallel. The input-side negative terminal 32 and the output-side negative terminal 42 are directly connected to each other by the circuit wiring (not shown) and also connected to the ground terminal 14 via the grounded capacitors 15. The backflow prevention circuit 100 is thus configured to flow current from the input-side positive terminal 31 toward the output-side positive terminal 41 but interrupt the two switching elements 21 and thereby prevent the backflow of current upon detection that a potential at the output-side positive terminal 41 exceeds a potential at the input-side positive terminal 31, for example.

Although the input-side connection terminal 30 and the output-side connection terminal 40 are each formed by a screw-type terminal block, the input-side connection terminal 30 and the output-side connection terminal 40 may be formed by other various types of connectors, for example.

The heat sink structure 50 absorbs heat radiated by the electronic components 20 requiring heat dissipation and releases the heat into the air. The heat sink structure 50 includes a heat sink member 51 disposed on the upper surface 10a side of the substrate 10, and a contacting member 52 disposed between the heat sink member 51 and the upper surface 10a. The heat sink member 51 is constituted by: a contact part 51a to be in contact with the electronic components 20 requiring heat dissipation via the contacting member 52; a heat-dissipating part 51b disposed at a position farther distant from the substrate 10 than the contact part 51a; and a connection part 51c for connecting between the rear-side end of the contact part 51a and the rear-side end of the heat-dissipating part 51b.

In the present embodiment, the heat sink member 51 is formed by bending a flat plate made of a material having high heat conductivity, such as aluminum, into a generally C-shape. Therefore, the contact part 51a, the heat-dissipating part 51b, and the connection part 51c are all formed into tabular shapes having substantially the same width W and thickness T. The contact part 51a and the heat-dissipating part 51b are disposed substantially parallel to the substrate 10, and the connection part 51c is disposed substantially perpendicular to the substrate 10.

The contact part 51a is a part that absorbs heat radiated by the electronic components 20 requiring heat dissipation from its lower surface 51a1 (surface on the substrate 10 side) and releases the heat into the air from its upper surface 51a2 (surface opposite to the substrate 10). The contact part 51a is formed in a size to cover the entire heat-dissipating region 12. Irrespective of the positions and the number of the electronic components 20 requiring heat dissipation, which are disposed in the heat-dissipating region 12, the contact part 51a can absorb and efficiently release the heat radiated by such electronic components 20 requiring heat dissipation collectively. Due to the contact part 51a made larger than the size of the electronic components 20 requiring heat dissipation, the heat capacity of the heat sink member 51 can be increased and the area of the upper surface 51a2, serving as a heat-dissipating surface, can be enlarged, thus achieving efficient heat dissipation.

The heat-dissipating part 51b is a part that releases heat, which is transferred from the contact part 51a via the connection part 51c, into the air mainly from a lower surface 51b1 (surface on the substrate 10 side) and an upper surface 51b2 (surface opposite to the substrate 10). In the present embodiment, an extended length Lb of the heat-dissipating part 51b from the connection part 51c is set larger than an extended length La of the contact part 51a from the connection part 51c. Heat dissipation area can thus be enlarged at a position more likely to be in contact with the air, thereby allowing for efficient heat dissipation. Additionally, this allows a space for disposing electronic components other than the electronic components 20 requiring heat dissipation to be sufficiently obtained on the upper surface 10a of the substrate 10 while enhancing the heat dissipation capacity of the heat sink member 51.

The connection part 51c is a part that transfers heat from the contact part 51a to the heat-dissipating part 51b and releases heat from the contact part 51a into the air mainly from its front surface 51c1 and its rear surface 51c2. In the present embodiment, the connection part 51c is formed in a tabular shape, as with the contact part 51a and the heat-dissipating part 51b, so as to enhance heat dissipation performance in the connection part 51c.

Furthermore, in the present embodiment, the heat sink member 51 is disposed in a dead space between the input-side connection terminal 30 and the output-side connection terminal protruded upward from the upper surface 10a of the substrate 10. This allows a height H of the connection part 51c to be increased in order to sufficiently obtain an interval between the contact part 51a and the heat-dissipating part 51b. Consequently, air inflow and outflow can be facilitated therebetween. This can enhance heat dissipation performance on the upper surface 51a2 of the contact part 51a, the lower surface 51b1 of the heat-dissipating part 51b, and the front surface 51c1 of the connection part 51c. Therefore, sufficient heat dissipation capacity can be exhibited with such a simple configuration of the heat sink member 51.

The contacting member 52 is made of a material having high heat conductivity and bendability, such as a silicone rubber sheet, for example. The contacting member 52 brings the electronic components 20 requiring heat dissipation and the heat sink member 51 into close contact with each other by being interposed therebetween and thus enhances the heat transfer coefficient. Although the contacting member 52 is formed in a size slightly larger than the heat-dissipating region 12 in the present embodiment, the contacting member 52 may be formed in a size smaller than the heat-dissipating region 12 or the contacting member 52 may be partially disposed only between the contact part 51*a* and the electronic component 20 requiring heat dissipation. Alternatively, silicone grease, for example, may be used instead of the contacting member 52. Depending on the type of the electronic component 20 requiring heat dissipation, for example, the contact part 51*a* and the electronic component 20 requiring heat dissipation may be in direct contact with each other.

Figure 5A:
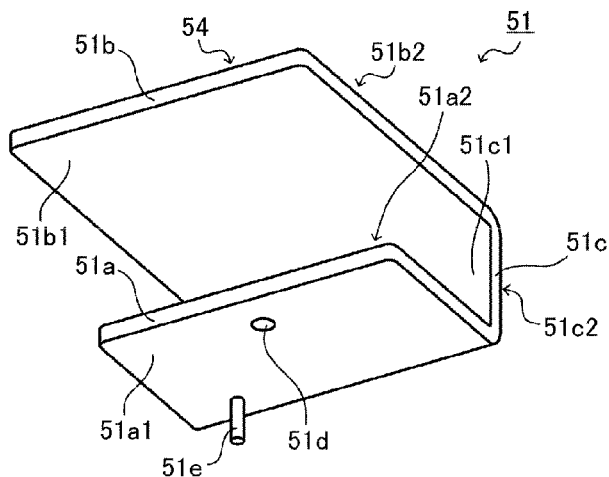
FIG. 5A is a schematic perspective view of a heat sink member as viewed from a substrate side.
Figure 5B:
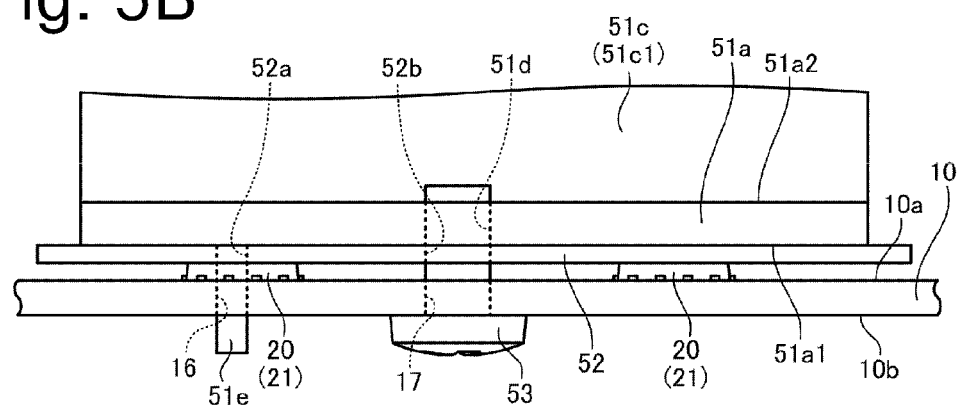
FIGS. 5B and 5C are schematic diagrams each showing an attachment portion between the heat sink member and a contacting member in an enlarged scale.
Figure 5C:
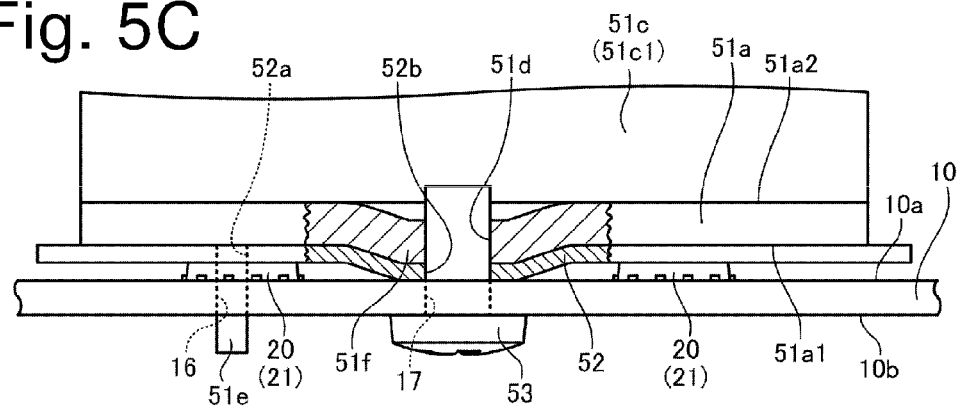

The heat sink member 51 and the contacting member 52 are attached to the substrate 10 with a screw 53. FIG. 5A is a schematic perspective view of the heat sink member 51 as viewed from the substrate 10 side. FIGS. 5B and 5C are schematic diagrams (views seen from the front side) each showing an attachment portion between the heat sink member 51 and the contacting member 52 in an enlarged scale. As shown in FIG. 5A, the contact part 51*a* of the heat sink member 51 is provided with a screw hole 51*d* in which an internal thread to be screwed with an external thread of the screw 53 is formed. The contact part 51*a* is also provided with a locking pin 51*e* protruded toward the substrate 10 from the lower surface 51*a*1.

As shown in FIG. 5B, the heat sink member 51 can be thus fixed to the substrate 10 in an extremely easy manner by disposing the heat sink member 51 on the upper surface 10*a* side of the substrate 10, inserting the locking pin 51*e* into a locking through-hole 52*a* of the contacting member 52 and a locking through-hole 16 of the substrate 10, and then screwing the screw 53, which has been inserted from the bottom surface 10*b* side of the substrate 10 into a fastening through-hole 17 of the substrate 10 and a fastening through-hole 52*b* of the contacting member 52, into the screw hole 51*d*. As the screw 53 screws into the screw hole 51*d*, the heat sink member 51 is pulled toward the substrate 10. Thus, the contact part 51*a* and the electronic components 20 requiring heat dissipation can be reliably brought into close contact with each other via the contacting member 52.

Note however that the substrate 10 may bend when the screw 53 screws with the screw hole 51*d* depending on the interval between the two electronic components 20 requiring heat dissipation, possibly causing a problem such that the contact part 51*a* and the electronic components 20 requiring heat dissipation fail to be in close contact with each other appropriately. In order to prevent such a problem, it is preferable that a protrusion 51*f* be provided by means of press working, for example, around the screw hole 51*d* in the lower surface 51*a*1 of the contact part 51*a* as shown in FIG. 5C. Alternatively, an appropriate washer, for example, may be disposed between the contact part 51*a* and the contacting member 52 or between the substrate 10 and the contacting member 52, although its diagrammatic illustration is omitted.

Referring back to FIGS. 1A to 4B, the heat sink structure 50 of the present embodiment can exhibit sufficient heat dissipation capacity even with its simple and compact configuration as stated above. Thus, heat radiated by the electronic components 20 requiring heat dissipation can be efficiently released and the level of safety can therefore be increased without deteriorating space efficiency. In the present embodiment, the space efficiency can be further improved and the level of safety can be further improved by providing an indication part 54 in the heat sink structure 50.

The indication part 54 is a part for indicating information mainly about connection of the input-side connection terminal 30 and the output-side connection terminal 40. The entire upper surface 51*b*2 (surface opposite to the substrate 10) of the heat-dissipating part 51*b* in the heat sink member 51 also serves as the indication part 54. In the present embodiment, the tabular heat-dissipating part 51*b* is disposed substantially parallel to the substrate 10. Thus, the upper surface 51*b*2 of the heat-dissipating part 51*b* also serving as the indication part 54 allows the information to be presented in an extremely easily viewable direction. Moreover, the heat-dissipating part 51*b* is disposed between the input-side connection terminal 30 and the output-side connection terminal 40 and the height of the upper surface 51*b*2 from the substrate 10 can be set in accordance with the height of the input-side connection terminal 30 and the output-side connection terminal 40. Thus, information about the connection of the input-side connection terminal 30 and the output-side connection terminal 40 can be presented at an extremely easily comprehensible position.

Specifically, a diode symbol is shown at a generally central portion of the indication part 54 in the present embodiment so as to indicate a current direction between the input-side connection terminal 30 and the output-side connection terminal 40. Furthermore, plus (+) signs are presented near the input-side positive terminal 31 and the output-side positive terminal 41 and minus (−) signs are presented near the input-side negative terminal 32 and the output-side negative terminal 42 so as to indicate polarities.

A front-side region of the indication part 54 is a region where a label showing various information, such as the serial number, rated voltage, and rated current of the electronic circuit device 1, is attached to. Such a region is provided with a generally L-shaped positioning mark for positioning the label. Note that these signs and the positioning mark are engraved on the indication part 54 by an appropriate technique such as laser machining or press working, for example. This allows the indication to be semipermanently preserved and this prevents the heat dissipation performance of the heat-dissipating part 51*b* from being inhibited.

Due to the upper surface 51*b*2 of the heat-dissipating part 51*b* also serving as the indication part 54 as described above, various information can be appropriately indicated without separately providing the indication part 54 and improper connection can thus be prevented from occurring. In other words, improved space efficiency and safeness of the electronic circuit device 1 can be achieved simultaneously. Moreover, the orientation of the heat sink member 51 is confined to a particular orientation by the locking pin 51*e* and the screw 53. Thus, the possibility of causing improper indication of the information about the connection, which is engraved on the indication part 54, is extremely low.

Figure 6A:
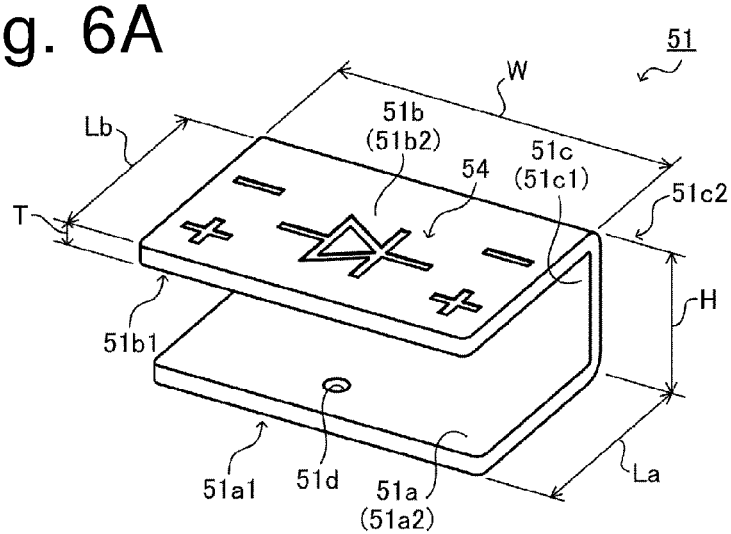
FIGS. 6A to 6C are schematic perspective views showing other configuration examples of the heat sink member.
Figure 6B:
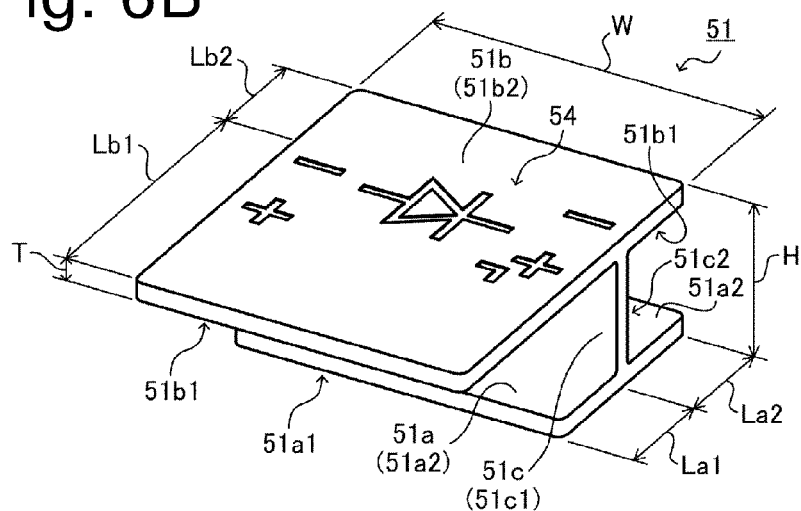
Figure 6C:
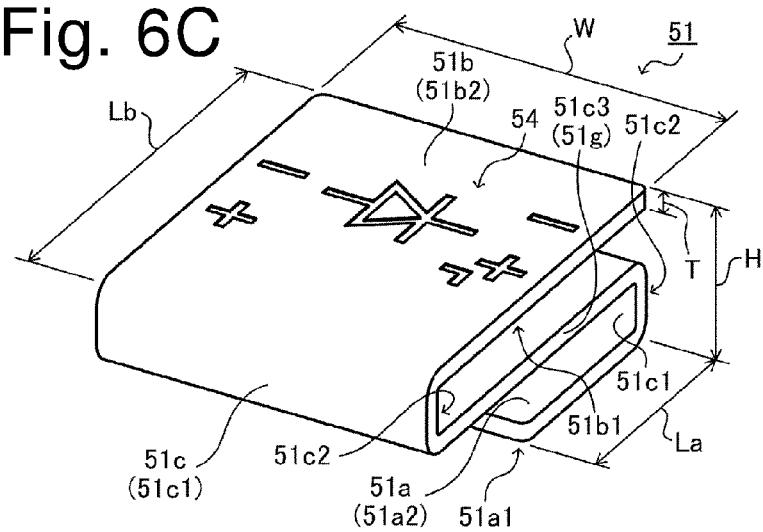

Other configurations of the heat sink member 51 will be described next. FIGS. 6A to 6C are schematic perspective views showing other configuration examples of the heat sink member 51. These figures show the heat sink members 51 as viewed from the side opposite to the substrate 10. The heat sink member 51 can employ various shapes without being limited to any particular shape as long as the heat sink member 51 has a generally tabular heat-dissipating part 51*b*.

For example, the heat sink member 51 may have the extended length La of the contact part 51a from the connection part 51c and the extended length Lb of the heat-dissipating part 51b from the connection part 51c approximately identical to each other as shown in FIG. 6A. Depending on the amount of heat generation in the electronic components 20 requiring heat dissipation or the size of the heat-dissipating region 12, the heat sink member 51 may be configured in such a manner. Although its diagrammatic illustration is omitted, the extended length La of the contact part 51a from the connection part 51c may be set larger than the extended length Lb of the heat-dissipating part 51b from the connection part 51c.

Alternatively, the heat sink member 51 may be configured such that the connection part 51c connects between middle portions of the contact part 51a and the heat-dissipating part 51b as shown in FIG. 6B. In other words, the heat sink member 51 may be configured to have a cross section in a horizontally-oriented generally H-shape. In such a case, the heat sink member 51 may be integrally formed by an extruded material such as aluminum, for example, or the heat sink member 51 may be formed by combining a plurality of flat plates. Also in this case, extended lengths La1 and La2 of the contact part 51a from the connection part 51c toward the front side and the rear side, respectively, as well as extended lengths Lb1 and Lb2 of the heat-dissipating part 51b from the connection part 51c toward the front side and the rear side, respectively, may be appropriately set depending on the amount of heat generation in the electronic components 20 requiring heat dissipation or the size of the heat-dissipating region 12, for example.

Alternatively, the heat sink member 51 may be configured such that the connection part 51c connects between the rear-side end of the contact part 51a and the front-side end of the heat-dissipating part 51b and the heat sink member 51 has an S-shaped cross section as shown in FIG. 6C. In such a case, the amount of heat dissipation from the connection part 51c can be increased. In particular, by providing a generally tabular parallel region 51c3, which is disposed substantially parallel to the substrate 10 as well as the contact part 51a and the heat-dissipating part 51b, in the connection part 51c as in the example shown in FIG. 6C, efficient heat dissipation can be achieved. Instead of providing the parallel region 51c3, the rear-side end of the contact part 51a may be linearly connected to the front-side end of the heat-dissipating part 51b so that the heat sink member 51 has a Z-shaped cross section.

Furthermore, the heat sink member 51 may have the contact part 51a, the heat-dissipating part 51b, or the connection part 51c having a different width W or a different thickness T, although its diagrammatic illustration is omitted. The heat sink member 51 may be provided with a through-hole at an appropriate position. The shapes of the contact part 51a and the heat-dissipating part 51b in the heat sink member 51 in a bottom surface view or in a planar view are not limited to any particular shapes. Any shapes can be employed depending on the shapes of the substrate 10 and the heat-dissipating region 12 or the arrangement of the input-side connection terminal 30 and the output-side connection terminal 40, for example. The connection part 51c may be formed in the shape of a prism or a cylinder, for example.

Figure 7A:
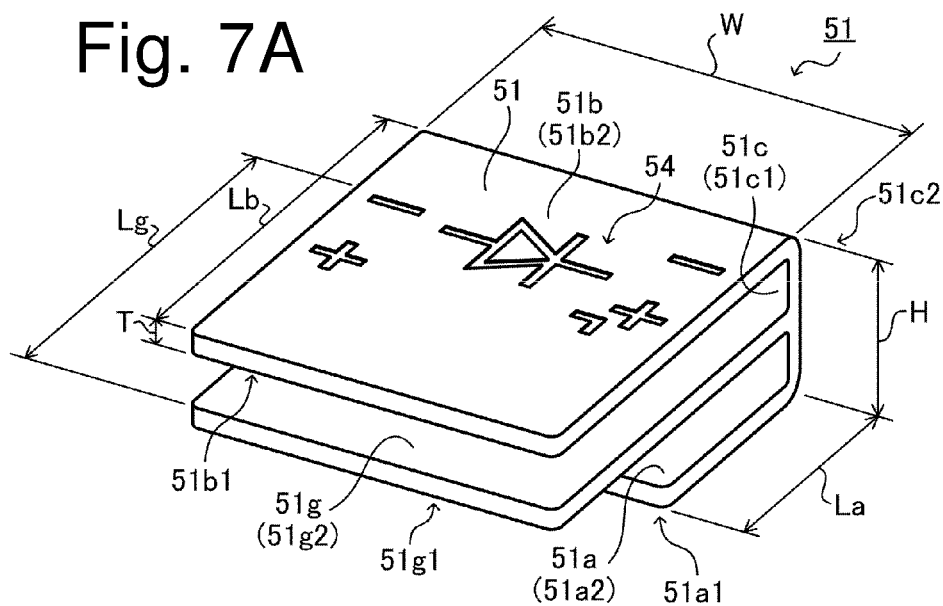
FIGS. 7A and 7B are schematic perspective views showing an example of the heat sink member when an auxiliary heat-dissipating part is provided.
Figure 7B:
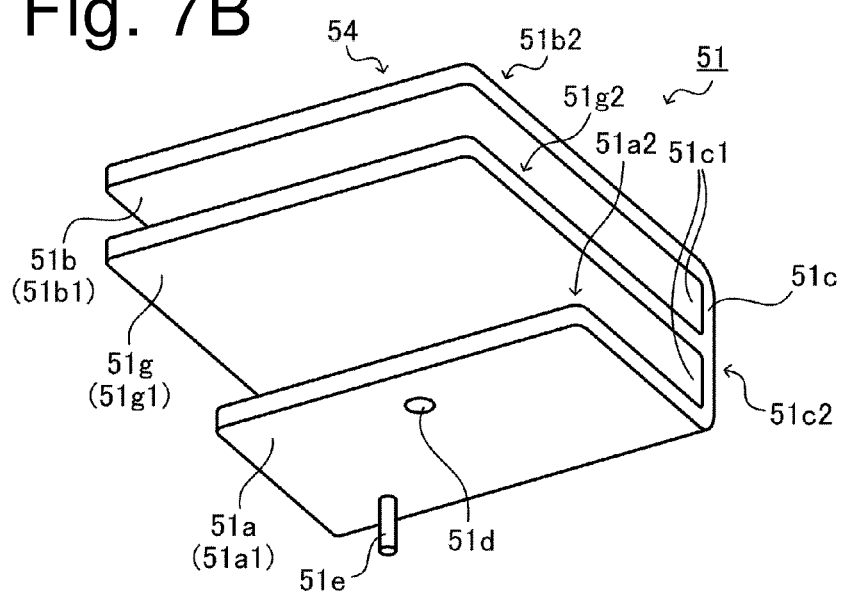

Alternatively, the heat sink member 51 may include an auxiliary heat-dissipating part 51g provided between the contact part 51a and the heat-dissipating part 51b. FIGS. 7A and 7B are schematic perspective views showing an example of the heat sink member 51 when the auxiliary heat-dissipating part 51g is provided. FIG. 7A shows the heat sink member 51 as viewed from the side opposite to the substrate 10, whereas FIG. 7B shows the heat sink member 51 as viewed from the substrate 10 side.

Figure 8A:
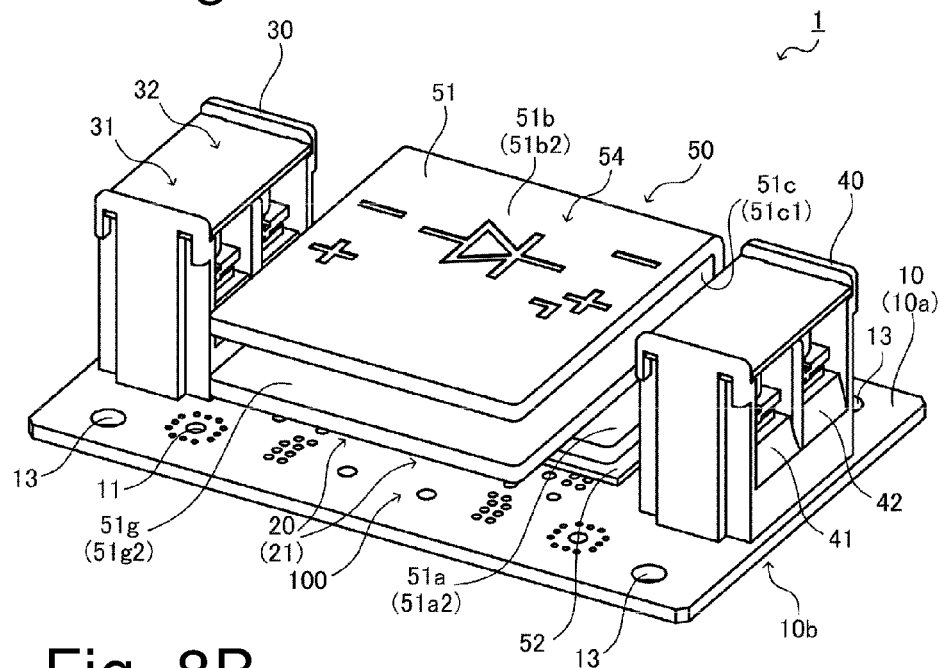
FIGS. 8A and 8B are schematic perspective views showing the electronic circuit device including the auxiliary heat-dissipating part.
Figure 8B:
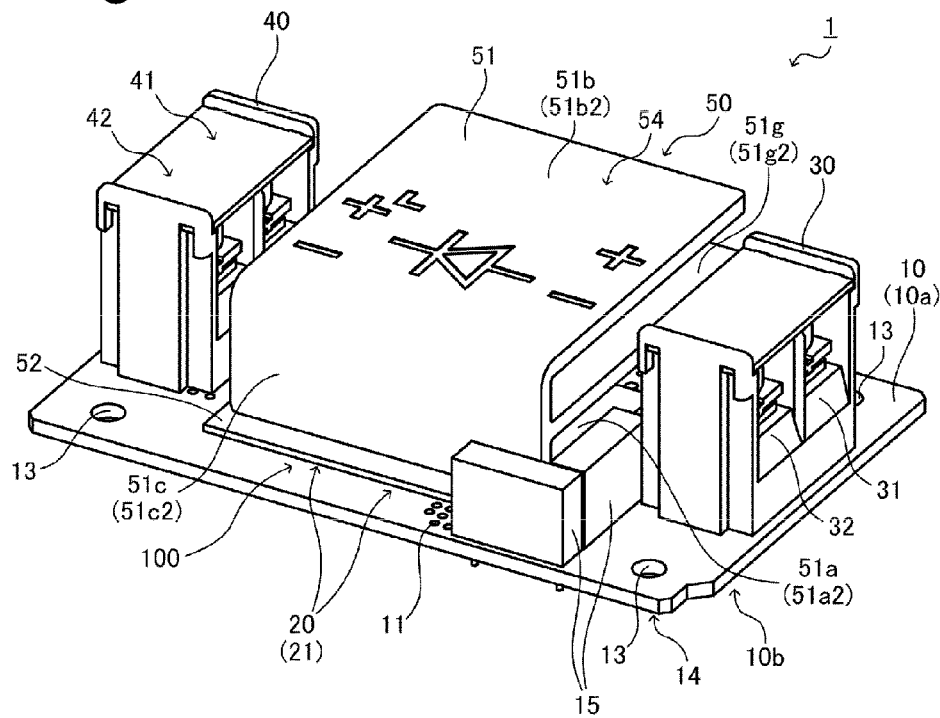
Figure 9A:
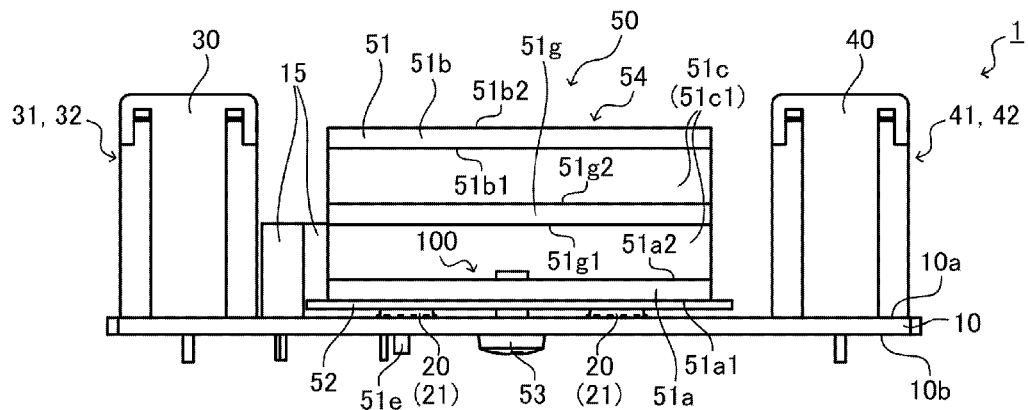
FIG. 9A is a schematic front view of the electronic circuit device including the auxiliary heat-dissipating part.
Figure 9B:
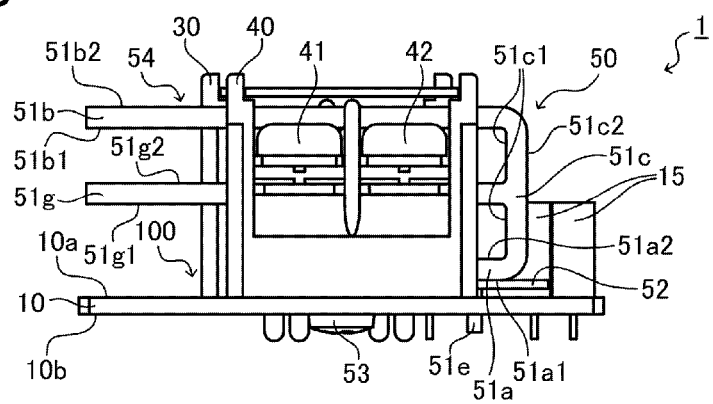
FIG. 9B is a schematic right side view of the electronic circuit device including the auxiliary heat-dissipating part.
Figure 9C:
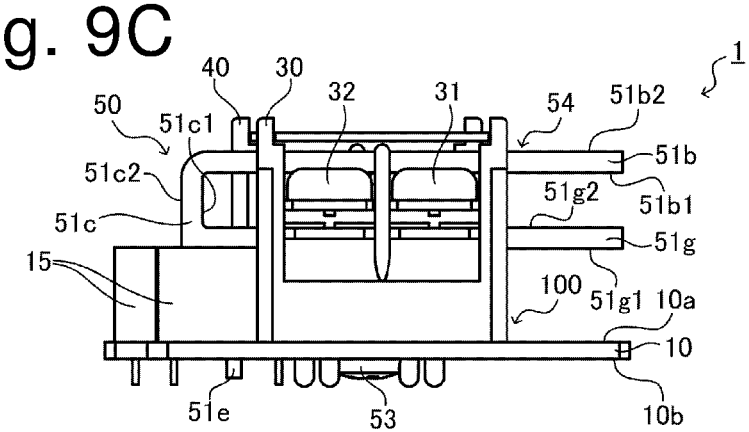
FIG. 9C is a schematic left side view of the electronic circuit device including the auxiliary heat-dissipating part.

FIGS. 8A and 8B are schematic perspective views showing the electronic circuit device 1 including the auxiliary heat-dissipating part 51g. FIG. 8A shows the electronic circuit device 1 as viewed from its front side, whereas FIG. 8B shows the electronic circuit device 1 as viewed from its rear side. FIG. 9A is a schematic front view of the electronic circuit device 1 including the auxiliary heat-dissipating part 51g, FIG. 9B is a schematic right side view of the electronic circuit device 1 including the auxiliary heat-dissipating part 51g, and FIG. 9C is a schematic left side view of the electronic circuit device 1 including the auxiliary heat-dissipating part 51g. The rear view, plan view, and bottom view in such a case are the same as those in FIG. 3B, FIG. 4A, and FIG. 4B, respectively, and the description thereof will be therefore omitted.

As shown in these figures, the auxiliary heat-dissipating part 51g is a generally tabular member extended toward the front side from a middle portion of the connection part 51c between the contact part 51a and the heat-dissipating part 51b. The auxiliary heat-dissipating part 51g is disposed substantially parallel to the substrate 10 as well as the contact part 51a and the heat-dissipating part 51b. In other words, the heat sink member 51 in this example has a generally E-shaped cross section. In the present embodiment, since the heat sink member 51 is disposed in the dead space between the input-side connection terminal 30 and the output-side connection terminal 40 as described above, the auxiliary heat-dissipating part 51g can be provided while ensuring a sufficient interval between the contact part 51a and the heat-dissipating part 51b.

Such provision of the auxiliary heat-dissipating part 51g can thus allow heat from the contact part 51a to be released into the air also from a lower surface 51g1 (surface on the substrate 10 side) and an upper surface 51g2 (surface opposite to the substrate 10) of the auxiliary heat-dissipating part 51g as with the heat-dissipating part 51b. Thus, heat dissipation can be performed more efficiently by effectively utilizing the dead space. Additionally, the provision of the auxiliary heat-dissipating part 51g can improve the heat dissipation capacity of the heat sink member 51 without enlarging the heat-dissipating part 51b and the contact part 51a. Thus, heat dissipation can be efficiently performed without deteriorating the space efficiency even when the amount of heat generation in the electronic components 20 requiring heat dissipation is large relative to the size of the substrate 10 or the heat-dissipating region 12, for example. Moreover, since the auxiliary heat-dissipating part 51g is disposed closer to the substrate 10 than the heat-dissipating part 51b, the visibility of various information shown on the indication part 54 is prevented from being disturbed.

Although an extended length Lg of the auxiliary heat-dissipating part 51g from the connection part 51c is set approximately the same as the extended length Lb of the heat-dissipating part 51b from the connection part 51c in the example shown in FIGS. 7A to 9C, the extended length Lg of the auxiliary heat-dissipating part 51g may be appropriately set in accordance with desired heat dissipation capacity. In other words, the auxiliary heat-dissipating part 51g may be configured such that the extended length Lg from the connection part 51c is larger or smaller than the extended length Lb of the heat-dissipating part 51b. Alternatively, the auxiliary heat-dissipating part 51g may be configured such that the extended length Lg from the connection part 51c is smaller than the extended length La of the contact part 51a.

The auxiliary heat-dissipating part 51g may have a width W and a thickness T substantially the same as, or different from, those in the contact part 51a or the heat-dissipating part 51b. The shape of the auxiliary heat-dissipating part 51g in a bottom surface view or in a planar view is not limited to any particular shape. The auxiliary heat-dissipating part 51g may have a shape same as, or different from, the shape of the contact part 51a or the heat-dissipating part 51b.

A single auxiliary heat-dissipating part 51g may be provided between the contact part 51a and the heat-dissipating part 51b as shown in FIGS. 7A to 9C. Alternatively, a plurality of auxiliary heat-dissipating parts 51g may be provided, although its diagrammatic illustration is omitted. When a plurality of auxiliary heat-dissipating parts 51g are provided, the extended lengths Lg from the connection part 51c, widths W, thicknesses T, and shapes in a planar view or a bottom surface view of the auxiliary heat-dissipating parts 51g may be identical to, or different from, one another.

Needless to say, the auxiliary heat-dissipating part 51g may be provided in the heat sink member 51 in the shape shown in FIG. 6B. In such a case, the auxiliary heat-dissipating part 51g may be provided in each of the front side and the rear side with respect to the connection part 51c, or the auxiliary heat-dissipating part 51g may be provided only in either the front side or the rear side.

Alternatively, the auxiliary heat-dissipating part 51g may be configured as a part of the connection part 51c without being limited to the structure extended from the connection part 51c, i.e., the structure connected to the connection part 51c. In other words, the parallel region 51c3 may be provided in the middle of the connection part 51c as in the example shown in FIG. 6C, and this parallel region 51c3 may function as the auxiliary heat-dissipating part 51g.

The heat sink member 51 including the auxiliary heat-dissipating part 51g may be integrally formed by an extruded material such as aluminum, for example, or such a heat sink member 51 may be formed by combining a plurality of members, for example, by stacking and welding two generally C-shaped members.

An electronic circuit device 2 according to a second embodiment of the present invention will be described next. The electronic circuit device 2 of the present embodiment is a device obtained by adding a protective case 60 for covering at least part of the substrate 10 and at least part of the heat sink structure 50 to the electronic circuit device 1 of the first embodiment. Therefore, parts identical to those in the first embodiment will be denoted by the same reference numerals and the description thereof will be omitted. Only parts relating to the protective case 60 will be described.

Figure 10A:
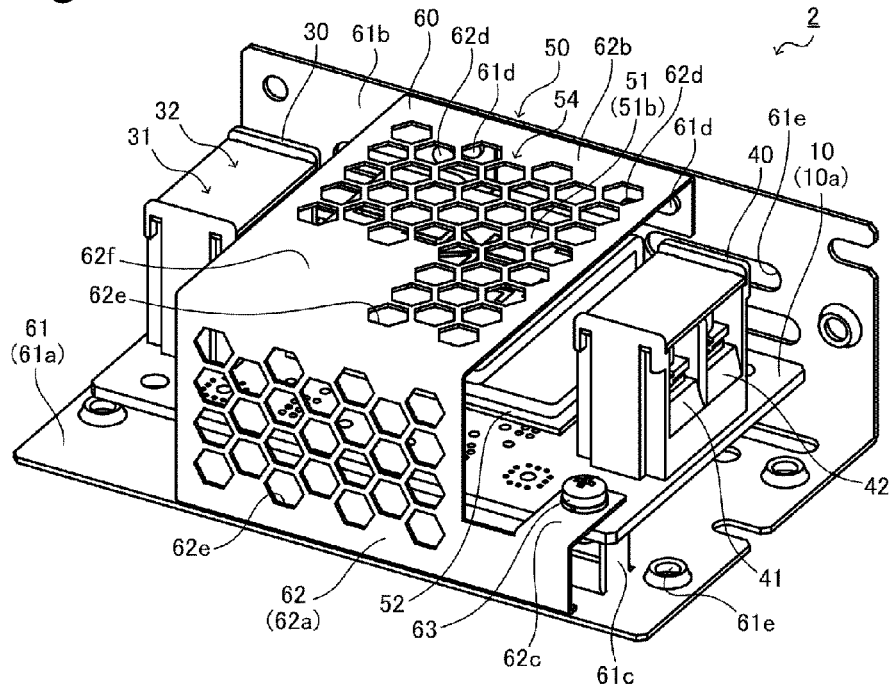
FIGS. 10A and 10B are schematic perspective views of an electronic circuit device according to a second embodiment of the present invention.
Figure 10B:
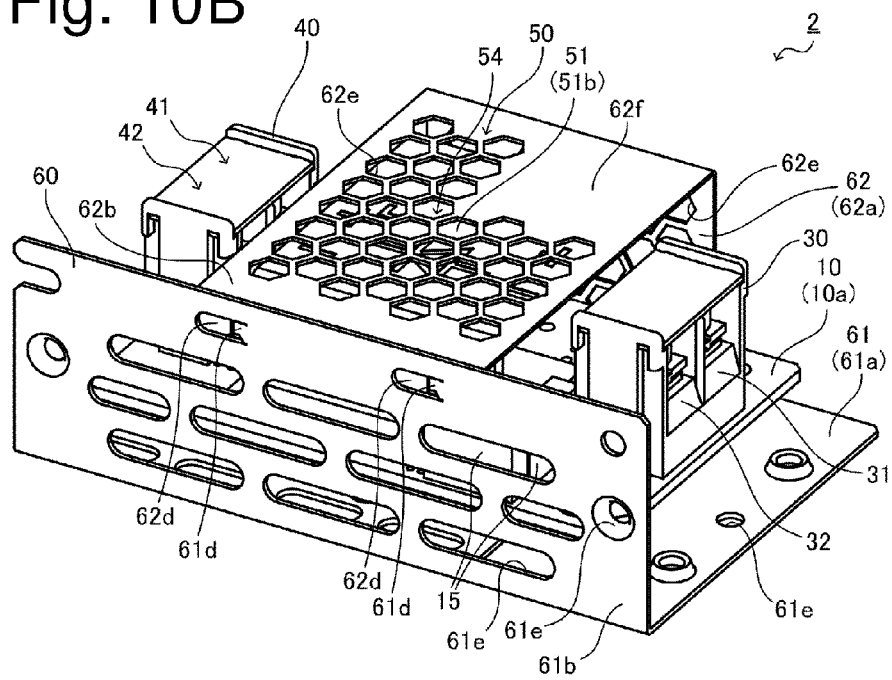
Figure 11:
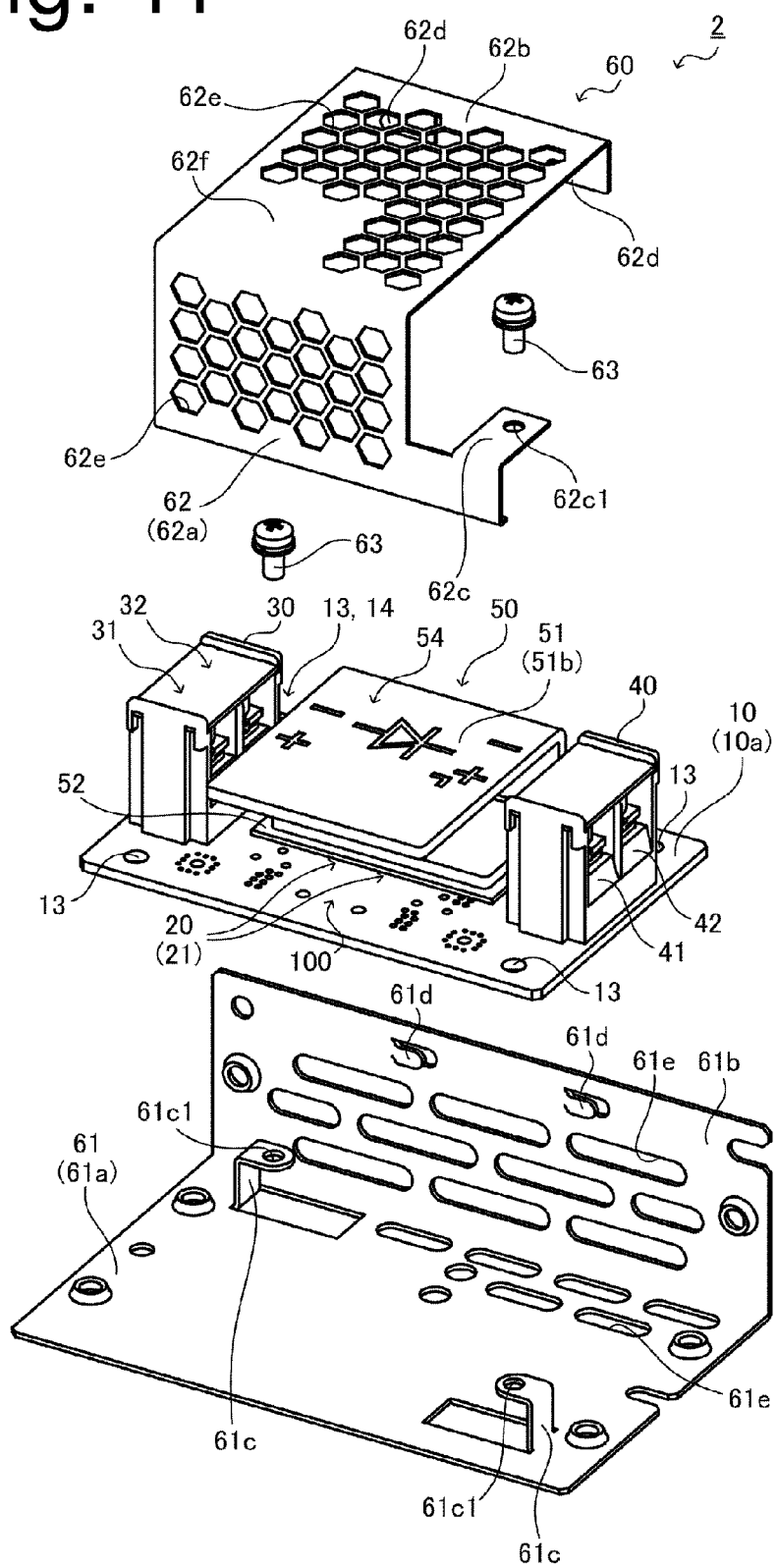
FIG. 11 is a schematic exploded perspective view of the electronic circuit device.
Figure 12A:
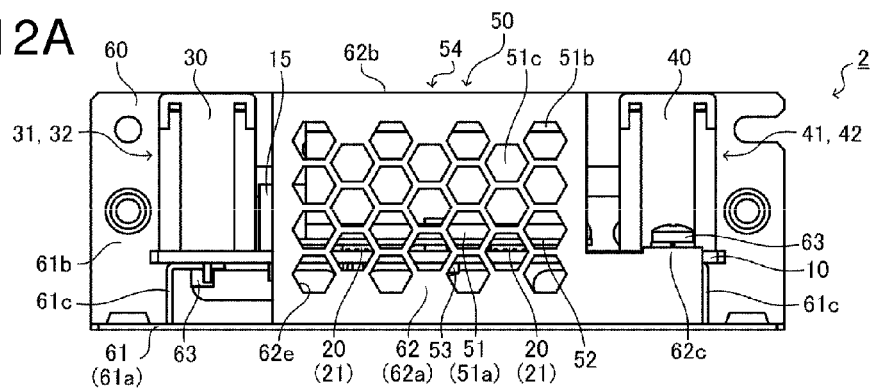
FIG. 12A is a schematic front view of the electronic circuit device.
Figure 12B:
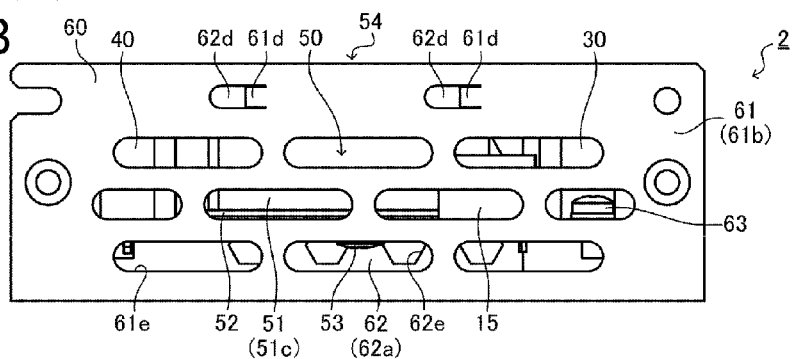
FIG. 12B is a schematic rear view of the electronic circuit device.
Figure 12C:
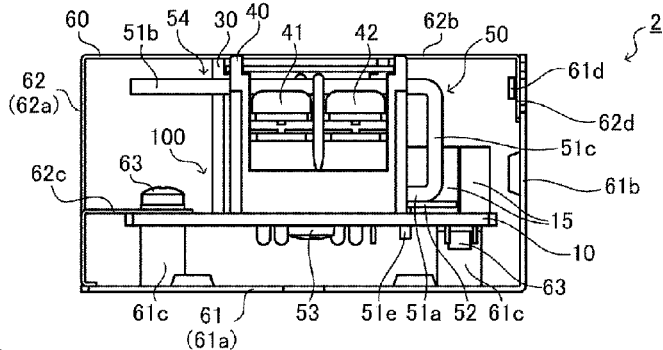
FIG. 12C is a schematic right side view of the electronic circuit device.
Figure 12D:
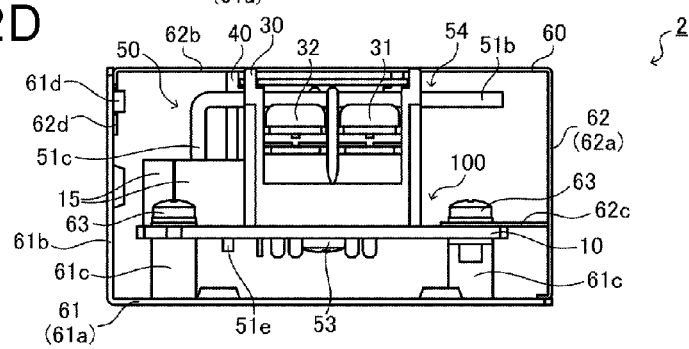
FIG. 12D is a schematic left side view of the electronic circuit device.
Figure 13A:
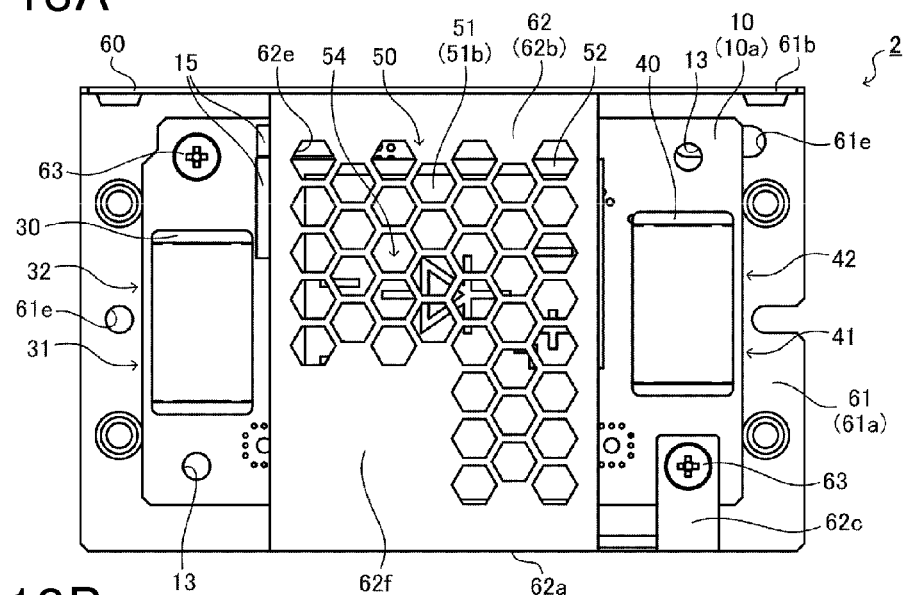
FIG. 13A is a schematic plan view of the electronic circuit device.
Figure 13B:
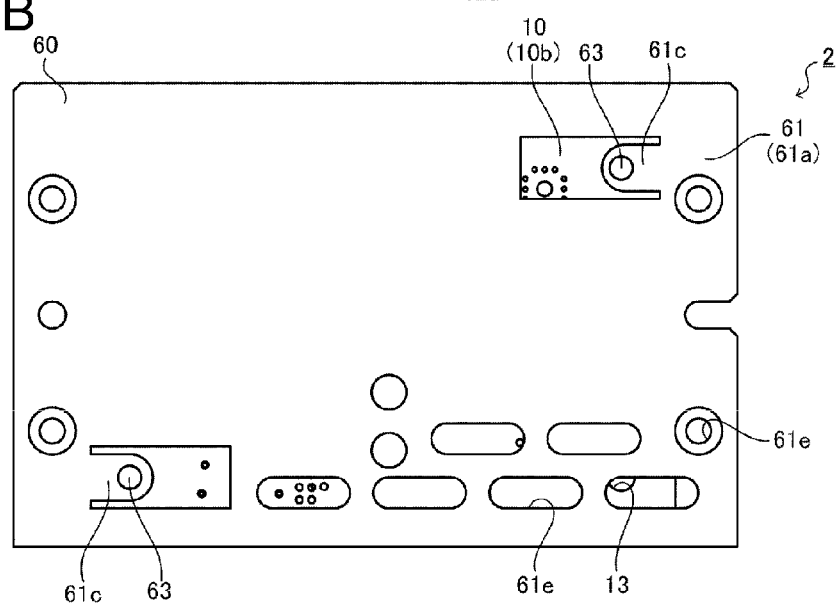
FIG. 13B is a schematic bottom view of the electronic circuit device.

FIGS. 10A and 10B are schematic perspective views of the electronic circuit device 2. FIG. 10A shows the electronic circuit device 2 as viewed from its front side, and FIG. 10B shows the electronic circuit device 2 as viewed from its rear side. FIG. 11 is a schematic exploded perspective view of the electronic circuit device 2. FIG. 12A is a schematic front view of the electronic circuit device 2, FIG. 12B is a schematic rear view of the electronic circuit device 2, FIG. 12C is a schematic right side view of the electronic circuit device 2, and FIG. 12D is a schematic left side view of the electronic circuit device 2. FIG. 13A is a schematic plan view of the electronic circuit device 2, and FIG. 13B is a schematic bottom view of the electronic circuit device 2.

As shown in these figures, the protective case 60 is constituted by a lower member 61 and an upper member 62. The lower member 61 is a member formed by bending a thin metal plate, such as iron, into a generally L-shape and constituted by a bottom surface part 61a and a rear surface part 61b. The bottom surface part 61a includes fixing legs 61c for fixing the substrate 10 at a rear-side left end portion and a front-side right end portion. The fixing leg 61c is formed by cutting and bending part of the bottom surface part 61a. The fixing legs 61c are configured so that the substrate 10 can be supported with a predetermined distance away from the bottom surface part 61a. The tip of the fixing leg 61c is provided with a screw hole 61c1. The substrate 10 is fixed by screwing a screw 63, which has been inserted into the through-hole 13, into the screw hole 61c1. The fixing leg 61c at the rear-side left end portion is in contact with the ground terminal 14 when the substrate 10 is fixed thereto.

Locking tongues 61d for locking the upper member 62 are provided at two positions in an upper end portion of the rear surface part 61b. The bottom surface part 61a and the rear surface part 61b are also provided with a plurality of through-holes 61e used for heat dissipation and various fixations.

The upper member 62 is a member formed by bending a thin metal plate, such as iron, into a generally L-shape and constituted by a front surface part 62a and an upper surface part 62b. The horizontal dimension of the upper member 62 is made smaller than that of the lower member 61. This allows the input-side connection terminal 30 and the output-side connection terminal 40 to be exposed. In other words, the upper member 62 is configured so as to cover part of the substrate 10 and the heat sink structure 50 from the front side and the rear side generally between the input-side connection terminal 30 and the output-side connection terminal 40.

A fixing tongue 62c, which is protruded toward the rear side, is provided at a right end portion of the front surface part 62a in the upper member 62. The tip of the fixing tongue 62c has a through-hole 62c1 at a position corresponding to the screw hole 61c1 of the fixing leg 61c provided at the front-side right end portion. Furthermore, hooks 62d for locking the locking tongues 61d of the lower member 61 are provided at two positions in a rear-side end portion of the upper surface part 62b. Thus, the upper member 62 is coupled with the lower member 61 together with the substrate 10 by locking the locking tongues 61d and the hooks 62d with each other and then screwing the screw 63, which has been inserted into the through-hole 62c1 of the fixing tongue 62c and the through-hole 13 of the substrate 10, into the screw hole 61c1 of the fixing leg 61c at the front-side right end portion.

The front surface part 62a and the upper surface part 62b of the upper member 62 are provided with a plurality of windows 62e, which are hexagonal through-holes. These windows 62e not only allow air to flow in and flow out therethrough in the vicinity of the heat sink structure 50 but also allow the indication of the indication part 54 in the heat sink structure 50 and the electronic components mounted on the substrate 10, for example, to be visually checked. An attachment region 62f where a label is attached to is provided at a front-side left end portion of the upper surface part 62b.

Specifically, in the present embodiment, the visibility of a label showing information such as a serial number, a rated voltage, and a rated current is ensured by attaching the label to the protective case 60 and the improper indication of information about the connection of the input-side connection terminal 30 and the output-side connection terminal 40 is prevented from occurring by allowing the indication in the indication part 54 of the heat sink structure 50 to be read through the windows 62e provided at positions corresponding to the heat-dissipating part 51b. If the information about the connection is indicated on the protective case, for example, improper indication may occur due to incorrect assembling of the protective case 60 to the substrate 10, for example. However, such a problem can be eliminated by allowing the indication on the indication part 54 of the heat sink structure 50 to be read through the windows 62e.

In this manner, the combinational use of the heat sink structure 50 including the indication part 54 and the protective case 60 including the windows 62e in the present embodiment can reliably prevent improper connection while appropriately protecting the substrate 10, the heat sink structure 50, etc., against external shock, for example. Furthermore, by omitting the indication of information on the protective case 60, the protective case 60 can be compactly formed and the ventilation characteristic, i.e., heat dissipation performance, of the protective case 60 can be improved.

Note that the shape of the window 62e is not limited to any particular shape. Other shapes such as a circular or rectangular shape, for example, may be employed. Any size of the window 62e and any number of windows 62e may be employed. For example, a single window 62e in the shape in accordance with the indication part 54 may be provided at a position corresponding to the indication part 54. Moreover, the window 62e may be provided with inserted transparent glass or resin, for example.

As described above, the electronic circuit devices 1 and 2 of the above embodiments each include: the substrate 10 with circuit wiring formed thereon; the electronic components 20 requiring heat dissipation, which are mounted on the substrate 10; and the heat sink structure 50 for dissipating heat radiated by the electronic components 20 requiring heat dissipation. The heat sink structure 50 includes: the contact part 51a to be in direct or indirect contact with the electronic components 20 requiring heat dissipation; the generally tabular heat-dissipating part 51b disposed substantially parallel to the substrate 10; and the connection part 51c for connecting between the contact part 51a and the heat-dissipating part 51b.

Such a configuration allows the simply and compactly configured heat sink structure 50 to exhibit sufficient heat dissipation capacity. Furthermore, such a configuration allows part of the heat-dissipating part 51b to also serve as the indication part 54 for indicating various information. Thus, improved space efficiency and safeness can be achieved simultaneously.

In the heat-dissipating part 51b, the surface opposite to the substrate 10 (upper surface 51b2) also serves as the indication part 54 for indicating information. With such a configuration, the heat sink structure 50 can be utilized to present various information, thus further improving space efficiency and safeness.

The electronic circuit devices 1 and 2 are each mounted on the substrate 10 and each include the connection terminals (the input-side connection terminal 30 and the output-side connection terminal 40) to be connected to external devices. Information about the connection of the connection terminals is presented on the indication part 54. This allows for the reliable prevention of improper connection without deteriorating space efficiency.

The heat-dissipating part 51b is disposed on the same side as the connection terminals (the input-side connection terminal 30 and the output-side connection terminal 40) with respect to the substrate 10. This allows information about the connection of the input-side connection terminal 30 and the output-side connection terminal 40 to be presented in an easily comprehensible manner at an appropriate position.

The electronic circuit devices 1 and 2 each include the two connection terminals (the input-side connection terminal 30 and the output-side connection terminal 40) to be connected to different devices, and the heat-dissipating part 51b is disposed between the two connection terminals. This allows information about connection to be presented in an easily comprehensible manner at an appropriate position while effectively utilizing the dead space between the input-side connection terminal 30 and the output-side connection terminal 40.

Information is engraved on the indication part 54. This allows the indication of the information to be semipermanently preserved and this prevents the heat dissipation performance of the heat-dissipating part 51b from being inhibited.

The contact part 51a is formed in a generally tabular shape disposed substantially parallel to the substrate 10. The connection part 51c is formed in a generally tabular shape continuously connecting between ends of the contact part 51a and the heat-dissipating part 51b positioned on the same side. This allows for efficient heat dissipation even with such a simple and compact configuration.

The extended length Lb of the heat-dissipating part 51b from the connection part 51c is larger than the extended length of the contact part 51a. This allows for efficient heat dissipation without affecting electronic components other than the electronic components 20 requiring heat dissipation.

The substrate 10 is provided with the heat-dissipating region 12 where the electronic components 20 requiring heat dissipation are disposed, and the contact part 51a is formed in a size to cover the entire heat-dissipating region 12. This allows the heat radiated by the electronic components 20 requiring heat dissipation to be efficiently absorbed and released into the air irrespective of the positions and the number of the electronic components 20 requiring heat dissipation.

A plurality of electronic components 20 requiring heat dissipation are disposed in the heat-dissipating region 12. This allows the heat radiated by the plurality of electronic components 20 requiring heat dissipation to be absorbed collectively and released collectively by the single heat sink structure 50 without providing a plurality of heat sink structures 50. Thus, efficient heat dissipation can be performed.

The contact part 51a may include the protrusion 51f on the surface closer to the substrate 10. This allows the heat sink member 51 to be stably fixed to the substrate 10 and allows the contact part 51a and the electronic components 20 requiring heat dissipation to be brought into close contact with each other appropriately.

The heat sink structure 50 may include the generally tabular auxiliary heat-dissipating part 51g connected to the connection part 51c or configured as a part of the connection part 51c. The auxiliary heat-dissipating part 51g may be disposed substantially parallel to the substrate 10 between the contact part 51a and the heat-dissipating part 51b. With such a configuration, the dead space can be utilized more effectively and efficient heat dissipation can be performed without enlarging the heat-dissipating part 51b and the contact part 51a.

The electronic circuit device 2 includes the protective case 60 for covering at least part of the substrate 10 and at least part of the heat sink structure 50. The protective case 60 is provided with the windows 62e at positions corresponding to the heat-dissipating part 51b. This allows various information to be reliably indicated by the indication part 54 of the heat sink structure 50 while appropriately protecting the substrate 10, the heat sink structure 50, etc., against external shock, for example.

The heat sink structure 50 according to the above embodiment includes: the contact part 51a to be in direct or indirect contact with the electronic components 20 requiring heat dissipation, which are mounted on the substrate 10; the generally tabular heat-dissipating part 51b disposed substantially parallel to the substrate 10; and the connection part 51c for connecting between the contact part 51a and the heat-dissipating part 51b. Such a configuration allows the simply and compactly configured heat sink structure 50 to exhibit sufficient heat dissipation capacity. Furthermore, such a configuration allows part of the heat-dissipating part 51b to also serve as the indication part 54 for indicating various information. Thus, improved space efficiency and safeness can be achieved simultaneously.

Although the embodiments of the present invention have been described above, the electronic circuit device and the heat sink structure for the electronic circuit device according to the present invention are not limited to the above embodiments. It is to be understood that various modifications are possible without departing from the scope of the present invention.

For example, the shapes and arrangement of the components in the electronic circuit devices 1 and 2 are not limited to those described in the above embodiments, and various shapes and arrangement can be employed. The electronic circuit devices 1 and 2 are not limited to those including the backflow prevention circuit 100. For example, the electronic circuit devices 1 and 2 may have other circuits such as an ORing circuit. The electronic circuit devices 1 and 2 are not limited to those to be connected to the output side of a power-supply device. These devices may be connected to other devices. Needless to say, the electronic components 20 requiring heat dissipation are not limited to the switching elements 21.

The functions and effects described in the above embodiments are merely the list of the most preferred functions and effects obtained by the present invention. The functions and effects of the present invention are not limited thereto.

The electronic circuit device and the heat sink structure for the electronic circuit device can be utilized in the field of various electronically or electrically-operated devices.

The entire disclosure of Japanese Patent Application No. 2015-155352 filed Aug. 5, 2015 including specification, claims, drawings, and summary are incorporated herein by reference in its entirety.

What is claimed is:

1. An electronic circuit device comprising: a substrate with circuit wiring formed thereon; first and second enclosures which are assembled on the substrate, the first enclosure is spaced apart from the second enclosure via a sandwiched area in a plan view, each of the first and second enclosures housing a connection terminal which is connectable to an external device; a heat dissipation required electronic component, which is mounted on the sandwiched area of the substrate; and a heat sink structure configured to dissipate heat radiated by the electronic component requiring, the heat sink structure including: a contact part which is directly or indirectly contacted to the electronic component; a generally tabular heat-dissipating part disposed substantially parallel to the substrate; and a connection part configured to connect between the contact part and the heat-dissipating part, wherein a height of each of the first and second enclosures is higher than a combined height of the electronic component and heat sink structure, and the heat sink structure is disposed within the sandwiched area.

2. The electronic circuit device according to claim 1, wherein the heat-dissipating part has a surface opposite to the substrate, and
indicative information is provided at the surface of the heat-dissipation part.

3. The electronic circuit device according to claim 2, wherein the indicative information corresponds to at least one of a current flowing direction and a polarity of the connection terminal.

4. The electronic circuit device according to claim 3, wherein the heat-dissipating part and the first and second enclosures are located at a same side of the substrate.

5. The electronic circuit device according to claim 4, wherein the connection terminals of the first and second enclosures are connected to different external devices, respectively, and
the heat-dissipating part is disposed between the two connection terminals in a cross-sectional view perpendicular to the plan view.

6. The electronic circuit device according to claim 2, wherein the indicative information is engraved on the surface of the heat-dissipation part.

7. The electronic circuit device according to claim 1, wherein
the contact part is formed in a generally tabular shape disposed substantially parallel to the substrate, and
the connection part is formed in a generally tabular shape continuously connecting between ends of the contact part and the heat-dissipating part positioned on a same side.

8. The electronic circuit device according to claim 2, wherein
the contact part is formed in a generally tabular shape disposed substantially parallel to the substrate, and
the connection part is formed in a generally tabular shape continuously connecting between ends of the contact part and the heat-dissipating part positioned on a same side.

9. The electronic circuit device according to claim 7, wherein an extended length of the heat-dissipating part extending from the connection part in a first direction is larger than an extended length of the contact part extending from the connection part in the first direction.

10. The electronic circuit device according to claim 1, wherein the contact part covers electronic component in its entirety in the plan view.

11. The electronic circuit device according to claim 7, wherein the electronic component is configured with a plurality of electronic components, and
the contact part covers the plurality of electronic components in their entirety in the plan view.

12. The electronic circuit device according to claim 10, wherein the electronic component is configured with a plurality of electronic components.

13. The electronic circuit device according to claim 1, wherein the contact part includes a protrusion on a surface closer to the substrate.

14. The electronic circuit device according to claim 7, wherein the contact part includes a protrusion on a surface closer to the substrate.

15. The electronic circuit device according to claim 10, wherein the contact part includes a protrusion on a surface closer to the substrate.

16. The electronic circuit device according to claim 1, wherein
the heat sink structure includes a generally tabular auxiliary heat-dissipating part connected to the connection part or configured as part of the connection part, and
the auxiliary heat-dissipating part is disposed substantially parallel to the substrate between the contact part and the heat-dissipating part.

17. The electronic circuit device according to claim 7, wherein
the heat sink structure includes a generally tabular auxiliary heat-dissipating part connected to the connection part or configured as part of the connection part, and
the auxiliary heat-dissipating part is disposed substantially parallel to the substrate between the contact part and the heat-dissipating part.

18. The electronic circuit device according to claim 1, comprising a protective case configured to cover at least part of the substrate and at least part of the heat sink structure, wherein
the protective case is provided with a window at a position directly adjacent to the heat-dissipating part.

19. The electronic circuit device according to claim 7, comprising a protective case configured to cover at least part of the substrate and at least part of the heat sink structure, wherein
the protective case is provided with a window at a position directly adjacent to the heat-dissipating part.

20. The electronic circuit device according to claim 3, wherein the indicative information is engraved on the surface of the heat-dissipation part.

21. The electronic circuit device according to claim 4, wherein the indicative information is engraved on the surface of the heat-dissipation part.

22. The electronic circuit device according to claim 5, wherein the indicative information is engraved on the surface of the heat-dissipation part.

23. The electronic circuit device according to claim 1, wherein the contact part has a locking pin projecting toward the substrate, and the substrate has a hole at a position corresponding to the locking pin, and
when the heat sink structure is assembled to the substrate, the locking pin is inserted into the hole so that an orientation of the heat sink structure is fixed to a predetermined orientation with respect to the substrate.

24. The electronic circuit device according to claim 2, wherein the indicative information corresponds to positive and negative polarity signs of the connection terminal.

* * * * *